US006509133B1

(12) United States Patent
Watanabe et al.

(10) Patent No.: US 6,509,133 B1
(45) Date of Patent: Jan. 21, 2003

(54) LITHOGRAPHIC PRINTING PLATE AND IMAGE FORMING METHOD

(75) Inventors: Yasuyuki Watanabe, Chiba (JP); Naohito Saito, Sakura (JP); Nansei Tashiro, Sodegaura (JP); Katsuji Takahashi, Sakura (JP); Shinji Shimizu, Tatebayashi (JP); Yasuhiko Kojima, Konosu (JP); Koji Oe, Kitamoto (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 0 days.

(21) Appl. No.: 09/537,473

(22) Filed: Mar. 24, 2000

(30) Foreign Application Priority Data

Mar. 25, 1999 (JP) .......................................... 11-081660
Mar. 25, 1999 (JP) .......................................... 11-081661

(51) Int. Cl.[7] ................................................ G03F 7/038

(52) U.S. Cl. ............................... 430/270.1; 430/281.1; 430/286.1; 430/287.1; 430/288.1; 430/302; 430/348; 430/944; 430/945; 430/964

(58) Field of Search ............................. 430/138, 270.1, 430/281.1, 286.1, 287.1, 288.1, 302, 348, 944, 945, 964

(56) References Cited

U.S. PATENT DOCUMENTS

| | | | | | |
|---|---|---|---|---|---|
| 3,630,732 | A | * | 12/1971 | Gravenwezel | 96/27 |
| 4,900,774 | A | * | 2/1990 | Mitsuji et al. | 524/512 |
| 5,206,104 | A | * | 4/1993 | Kato | 430/96 |
| 5,275,916 | A | * | 1/1994 | Kato | 430/286 |
| 5,948,599 | A | * | 9/1999 | Gardner et al. | 430/330 |
| 5,981,144 | A | * | 11/1999 | Damme et al. | 430/271.1 |
| 6,114,083 | A | * | 9/2000 | Kawamura et al. | 430/270.1 |
| 6,218,073 | B1 | * | 4/2001 | Shimizu et al. | 430/273.1 |
| 6,300,032 | B1 | * | 10/2001 | Van Damme et al. | 430/188 |
| 6,340,554 | B1 | * | 1/2002 | Kawamura et al. | 430/270.1 |
| 6,367,383 | B1 | * | 4/2002 | Leenders et al. | 101/465 |
| 2001/0026900 | A1 | * | 10/2001 | Shimada et al. | 430/138 |
| 2002/0081529 | A1 | * | 6/2002 | Sonokawa | 430/303 |

FOREIGN PATENT DOCUMENTS

| | | | | |
|---|---|---|---|---|
| EP | 0 599 510 | A2 | | 6/1994 |
| EP | 0 800 928 | A1 | | 10/1997 |
| EP | 0 802 457 | A1 | | 10/1997 |
| JP | 9-127683 | | | 5/1997 |
| JP | 9-171249 | | | 6/1997 |
| JP | 9-171250 | | | 6/1997 |
| JP | 11024248 | A | * | 1/1999 |
| JP | 11-153859 | | | 6/1999 |
| JP | 11158223 | A | * | 6/1999 |
| JP | 2000338653 | A | * | 12/2000 |

OTHER PUBLICATIONS

Miall, L. Mackenzie, and D.W.A. Sharp, eds. A New Dictionary of Chemistry, 4th Ed. London: Longman, 1968. p. 220.*

* cited by examiner

*Primary Examiner*—Janet Baxter
*Assistant Examiner*—Barbara Gilliam
(74) *Attorney, Agent, or Firm*—Armstrong, Westerman & Hattori, LLP

(57) ABSTRACT

In order to provide a computer-to-plate (CTP) plate in which an image can be inscribed by a laser beam having Ithe maximum strength in a near infrared or infrared region, and heat processing is not necessary prior to developing a latent image, and which allows the use of a conventional printing apparatus as it is upon printing, (I) a lithographic printing plate is provided which has on a substrate, a photosensitive layer comprising a photosensitive composition containing a crosslinking agent, an aqueous dispersion of resin fine particles made of a resin which is self water-dispersible having a carboxylic group and a functional group capable of performing cross-linking reactions with the crosslinking agent, and an infrared absorption agent; and (II) an image forming method is provided which is characterized in that after an image has been formed on a photosensitive layer of the lithographic printing plate set forth in the above (I) by using a laser beam, the image is subjected to wet development.

9 Claims, No Drawings

LITHOGRAPHIC PRINTING PLATE AND IMAGE FORMING METHOD

BACKGROUND OF THE INVENTION

1. Field of the Invention

The present invention relates to a lithographic printing plate useful as a so-called computer-to-plate. (CTP) plate that is applicable to direct plate making based on digital signals from a computer or the like, as a lithographic printing plate used in the field of offset printing, and more particularly to a lithographic printing plate having a photosensitive layer wherein a latent image is obtained by irradiation of a high power laser having the maximum strength in a near infrared or infrared region, and the latent image is wet developed to thereby form an image.

2. Description of Related Art

With the development of the computer image processing technology, there has been recently developed a method for inscribing an image directly on a photosensitive layer by means of photoirradiation corresponding to digital signals. A computer-to-plate (CTP) system which utilizes the method for a lithographic printing plate and forms an image directly on the printing plate without outputting the image to a silver salt mask film has attracted much attention.

The CTP system having the maximum strength in a near infrared or infrared region and using high power lasers has attracted attention because of the availability of compact and high power lasers, and because it provides a high resolution image with a short period of exposure and the printing plate used for the method may be handled in a lighted room.

As a lithographic printing plate used for the CTP system that uses such a light source, there is disclosed a lithographic printing plate having a photosensitive layer containing a substance which generates acid due to heat (acid generating agent), an infrared absorption agent, a crosslinking agent which crosslinks due to heat, and a resin having a fimctional group capable of crosslinking reactions with the crosslinking agent, in Japanese Patent Unexamined Publications No, 10-228109. The lithographic printing plate, however, has a problem in the preservation stability of the acid generating agent, and a practical problem in that it requires heat processing prior to development after the laser irradiation, in order to accomplish a cation polymerization reaction accompanying the acid generation, hence causing a problem in the reproducibility of halftone dots.

On the other hand, as a lithographic printing plate which does not require heat processing prior to development, after the laser irradiation, in Japanese Patent Unexamined Publication No. 9-171249, there is disclosed a lithographic printing plate in which hydrophobic thermoplastic polymer particles dispersed in a hydrophilic resin are formed on a hydrophilic substrate. With this lithographic printing plate, an image is formed by utilizing a difference in the solubility with respect to the developer between resin fine particles fuision-bonded due to heat and resin fine particles not fusion-bonded. However, this system has problems in that since hydrophobic fine particles that are insoluble in the developer have to be developed together with the hydrophilic resin, the sensitivity, preservation stability and printing resistance are low, and in order to actually utilize it as a printing plate, heat processing is essential after the development. Moreover, in Japanese Patent Unexamined Publication No. 9-171250, there is disclosed a lithographic printing plate in which a hydrophilic resin is crosslinked by means of heat in order to improve the printing resistance, however, since the resin fine particles are not involved in the crosslink, sufficient printing resistance cannot be exerted, and there is also a problem in the preservation stability.

Furthermore, in Japanese Patent Unexamined Publication No. 9-127683, there is disclosed a lithographic printing plate in which a selfwater-dispersible thermoplastic resin particle layer which can be made lipophilic by means of heat is formed on the surface of a hydrophilic substrate. Since this lithographic printing plate does not contain an infrared absorption agent, the sensitivity is low, and in some cases, it is necessary to form a film for prevention of drying out that can be peeled off, such as PET or the like on the resin particle layer, in order to increase the preservation stability. Moreover, when a polyvalent metal ion is used as a crosslinking agent in order to improve the printing resistance, there is a tendency that the development property decreases with the lapse of time.

BRIEF SUMMARY OF THE INVENTION

For obviating the above-described problems, it is an object of the present invention to provide a computer-to-plate (CTP) plate in which an image can be inscribed by a laser beam having the maximum strength in a near infrared or infrared region, and heat processing is not necessary prior to developing a latent image, and which allows the use of a conventional printing apparatus as it is upon printing.

The present inventors made investigations with a view to attaining the above objectives. As a result, the present invention has been completed based on the finding of a novel process of obtaining a printing plate which uses, as a mechanism for forming an inscribed image on a photosensitive layer with high density energy light, formation of a latent image comprising a portion where resin fine particles in the image portion are mutually melted and/or fused due to the heat generated by absorption of light energy and subjected to a polycondensation reaction or polyaddition reaction with the crosslinking agent by means of heat, and subsequent development of the latent image by dissolution and removal of a non-image portion by dipping the lithographic printing plate in a processing solvent, as opposed to a conventional mechanism utilizing only a chemical reaction such as polymerization reaction on a so-called PS plate or the like involving light energy and a monomer that uses a photoinitiator or an acid generating agent (negative type PS plate), or modification accompanying partial decomposition reaction of a polymer with light energy (positive type PS plate).

That is to say, to attain the above described object, the present invention provides (I) a lithographic printing plate having on a substrate, a photosensitive layer comprising a photosensitive composition containing a crosslinking agent, a water dispersion of resin fine particles having a functional group capable of performing cross-linking reactions with the crosslinking agent, and an infrared absorption agent.

Moreover, to attain the above described object, the present invention provides (II) an image forming method characterized in that after an image has been formed on a photosensitive layer of the lithographic printing plate set forth in the above (I) by using a laser beam, the image lis subjected to wet development.

With the lithographic printing plate of the present invention, a plate can be made up without preheating, after the laser inscription. Moreover, the resin fine particles are soluble in an alkaline developer, and are mutually capable of performing cross-linking reactions by means of heat. Hence, the results of sensitivity and preservation stability tests (at 60° C., for 15 hours) are excellent, and show a printing resistance such that the plates can be used sufficiently even just after development. Moreover, it is possible to provide a practical printing plate having an excellent printing resistance by means of burning.

DETAILED DESCRIPTION OF THE INVENTION

The crosslinking agent used in the present invention refers to a crosslinking agent that crosslinks particles with each other by means of heat. For example, there can be used one having a carbodiimide group as a functional group, one having an oxazoline group, one having an amino group or a methylol or alkoxymethyl group, or one generally and widely used as a crosslinking agent. The particles of the present invention are used as water dispersion bodies. Therefore, an aqueous-type crosslinking agent is preferably used.

As the crosslinking agent having an amino group, a methylol group or an alkoxymethyl group, it is preferable to use amino compounds or amino resins, for example, phenol derivatives, melamine derivatives, benzoguanamine derivatives or the like obtained by reacting formaldehyde and, according to need, alcohol with phenol, melamine, benzoguanamine or the like, respectively, in a known method.

As the benzoguanamine derivatives, for example, amino compounds or amino resins derived from 2-, 3- or 4-(4,6, diamino-1,3,5-triazine-2-yl) benzoic acid represented by the general formula [1]:

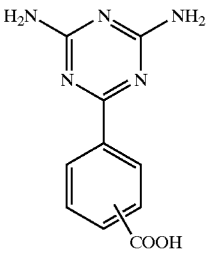

[1]

are preferable. In addition, among compounds represented by the general formula [I], 2-(4,6,diamino-1,3,5-triazine-2-benzoic acid disclosed in Japanese Patent Unexamined Publication No. 9-143169 is preferably used, because it can be obtained at high yield and high purity.

Amino compounds or amino resins derived from 2-(4,6, diamino-1,3,5-triazine-2-yl) benzoic acid can be prepared by reacting 2-(4,6,diamino-1,3,5-triazine-2-yl) benzoic acid singly, or a mixture with at least one kind of urea, melamine, benzoguanamine or the like, with an aidehyde compound and an alcohol compound. The methylolation reaction and alkyletherification (acetalization) reaction can be performed based on known methylolation reaction and alkyletherification (acetalization) reaction of melamine described in "Yuria/Meramin Jushi" (Urea/Melamine Resin) (published by Nikkan Kogyo Shimbunsha, 1969), "Koubunshi Jikkengaku Kouza 11 Jushukugou to Jufika Hannou" (Polymer Experimentation Seminar 11—Polycondensation and Polyaddition Reaction) (published by Kyoritsu Shuppan, 1958), "Koubunshi Jikkengaku 5 Jushukugou to Jufuka" (Polymer Experimental Science 5—Polycondensation and Polyaddition) (published by Kyoritsu Shuppan, 1980), "Toryou Jushi no Kagaku" (Chemistry of Paint Resin") (published by Shoukodo, 1972), "Purasuchikku Zairyou Kouza 3 Meramin Jushi" (Plastic Materials Seminar 3—Melamine Resin) (published by Nikkan Kogyo Shimbunsha, 1961), and "Koubunshi Gousei Jikkennhou" (Polymer Synthesis Experimentation) (published by Tokyo Kagaku Dojin, 1966).

As the aldehyde compounds, for example, there can be mentioned formaldehyde, paraformaldehyde, acetoaldehyde, propionaldehyde, butylaldehyde, glyoxal, glyoxylic acid, and semialdehyde succinate. Among them, formaldehyde and paraformaldehyde are preferably used in view of reactivity.

As the alcohol compounds, it is preferable to use an aliphatic alcohol containing not more than 4 carbon chains, and for example, there can be mentioned methanol, ethanol, npropyl alcohol, isopropyl alcohol, n-butyl alcohol, i-butyl alcohol and the like. These alcohol compounds may be used singly, or in combination thereof.

The amino compounds or amino resins derived from 2-(4,6,diamino-1,3,5-triazine-2-yl) benzoic acid can be prepared by mixing 2-(4,6,diamino-1,3,5-triazine-2-yl) benzoic acid singly, or a mixture with at least one kind of urea, melamine, benzoguanamine or the like, with an aldehyde compound and an alcohol compound, and reacting them at about 40 to 120° C.

In the photosensitive composition of the present invention, when the preservation stability is required, it is required that the photosensitive composition has low reactivity at a low temperature. Also, when the photosensitive composition is utilized as a lithographic printing plate, it is also required that it has excellent ink acceptability. Therefore, it is preferable to use amino compounds or amino resins having an alkoxymethyl group that has fewer amino groups or methylol groups, i.e., that is highly alkyletherified (acetalized).

The rate of these crosslinking agents to be used in total solids of the photosensitive material in the present invention is preferably from 0.1 to 60% by weight, and more preferably, from 1 to 40% by weight. If the rate of the crosslinking agent to be used is less than 1% by weight, the effects of crosslink cannot be obtained, and if the rate of the crosslinking agent to be used exceeds 40% by weight, the photosensitive composition layer of the present invention becomes brittle, which is not desirable.

The water dispersion bodies of resin fine particles used in the present invention means fine particles comprising a resin of an average particle diameter of from 0.005 to 1 micrometers (μm), having a functional group contained in the crosslinking agent and a functional group capable of performing crosslinking reactions. The functional groups contained in the fine particles include, for example, carboxyl group, hydroxyl group, glycidyl group, amino group and the like.

As the method of preparing resin fine particles, for example, there can be mentioned a method in which fine particles are formed in a process of synthesizing the resin, or a method in which a synthesized or existing resin is finely granulated. The former method includes an emulsion polymerization method, a soap-free emulsion polymerization method and the like. The latter method includes a pulverization method which obtains fine particles by pulverizing massive polymers, an emulsification method which emulsifies a resin using an emulsifier, or like methods. With the pulverization method, since it is difficult to obtain uniform particles of less than 1 μm, it is not suitable for use for the photosensitive composition of the present invention. On the other hand, with the emulsion polymerization method or the emulsification method, the emulsifier remains, and depending upon the kinds and used amount of the emulsifier, it affects the sensitivity and ink acceptability. Hence, sufficient care should be taken in selecting the emulsifier.

In addition, resin fine particles can be obtained by providing the resin with a functional group which imparts a self water-dispersing ability and dispersing the resin into water by a phase inversion emulsification method. This method is excellent as the preparation method for the resin fine particles used in the present invention, because an emulsifier is not used, various funictional groups can be introduced into the resin prior to water dispersion, and the particle diameter of the resin fine particles can be easily changed. The resin fine particles used in the present invention are required to have a functional group capable of reacting with a crosslinking agent, hence this method which can introduce various functional groups is quite advantageous. Generally, the resin fine particles obtained by the emulsification method and the phase inversion emulsification method may have a film formation property with the resin fine particles only, and in the present invention, such resin fine particles are preferably used.

Below is a description of a method for obtaining resin fine particles having a functional group capable of performing cross-linking reactions with a crosslinking agent by the phase inversion emulsification method. The self water-dispersible resin used for the phase inversion emulsification method is a general term for resins that can be dispersed in water without using an emulsifier, and includes such resins that change to a slightly turbid and transparent state and ones that change to a whitened and suspended state, if the resin is dispersed singly in water, and generally refers to a resin that can be dispersed so as to have an average particle diameter of from 0.005 to 1 micrometer ($\mu$m) of the dispersed particle. In order to impart water dispersibility to the resin, hydrophilic groups in an amount required for dispersing the resin in water have only to be introduced into the resin. The hydrophilic groups include anionic groups, cationic groups and nonionic groups. The kind of the hydrophilic groups is determined by the selection of the developer, and for example, when an alkaline developer is used, anionic resins are used, and when an acidic developer is used, cationic resins are used. When water is used as the developer, any of anionic groups, cationic groups and nonionic groups may be used. As the developer, an alkaline developer is generally used, and in this case, the anionic resin may be used.

The self Water-dispersible resin used for the phase inversion emulsification method is not particularly limited, so far as it is a resin having self water dispersibility, and for example, polymerization-type resins such as acrylic resin or the like, and condensation-type resins such as polyester resin, urethane resin or the like can be used.

When an anionic acrylic resin is used as the self water-dispersible resin, a polymerizable monomer having acid groups is used for at least one kind of the polymerizable compositions serving as a material, and after copolymerizing the material with a polymerizable monomer having other polymerizable vinyl groups, according to need, by a known conventional method, a necessary amount of the copolymerized material may be neutralized with a base. When a functional group capable of performing cross-linking reactions with a crosslinking agent is introduced into the resin at the time of polymerization, after copolymerizing in a similar manner, a composition containing a polymerizable monomer having a functional group capable of performing cross-linking reactions with a crosslinking agent, a polymerizable monomer having an acid group, and according to need, a polymerizable monomer having other polymerizable vinyl groups, a necessary amount of the copolymerized material may be neutralized with a base. It is a matter of course that when the functional group capable of performing cross-linking reactions with a crosslinking agent is the same, with the functional group in the polymerizable monomer, a composition containing a polymerizable monomer having an acid group, and according to need, a polymerizable monomer having other polymerizable vinyl groups may be used to prepare the resin in the similar manner as described above.

The polymerizable monomer having an acid group includes, for example, vinyl monomers having carboxyl groups such as (meth) acrylic acid, crotonic acid, itaconic acid, maleic acid (anhydride), fumaric acid, monobutyl itaconate and monobutyl maleate; vinyl monomers having carboxyl groups such as acid phosphoxyethyl methacrylate; vinyl monomers having sulfonic groups such as 2-chloroacrylamide-2-methylpropane sulfonate; and vinyl monormers having sulfate groups such as 2-sulfoethyl (meth) acrylate.

The polymerizable monomer having a functional group capable of performing crosslinking reactions with a crosslinking agent has a different functional group capable of performing cross-linking reactions depending upon the crosslinking agent to be used. As the crosslinking agent, when amino compounds such as phenol derivatives, melamine derivatives and benzoguanamine derivatives are used, functional groups capable of performing crosslinking reactions include hydroxyl groups, amino groups, amide groups, carboxyl groups and glycidyl groups. Considering polymerization with a polymerizable monomer having acid groups, usage of monomers containing glycidyl groups that react with acid groups or amino groups that forms salt with the acid groups may cause gelation. Therefore, it is preferable to use polymerizable monomers having hydroxyl groups, amide groups and carboxyl groups as the polymerizable monomer having a functional group capable of performing cross-linking reactions with a crosslinking agent.

Polymerizable monomers having hydroxyl groups include, for example, hydroxymethyl (meth) acrylate, 2-hydroxyethyl (meth) acrylate and 2-hydroxypropyl (meth) acrylate. Polymerizable monomers having amide groups include, for example, (meth)acrylamide. Polymerizable monomers having carboxyl groups include, for example, vinyl monomers having carboxyl groups described in the above polymerizable monomers having acid groups.

As the crosslinking agent, this is not limited to the amino compounds, and in that case, a polymerizable monomer having a functional group that reacts with a crosslinking agent which does not cause a problem of gelation or the like at the time of polymerization can be optionally used.

Polymerizable monomers having other polymerizable vinyl groups which can be used according to need, as the monomer constituting the self water-dispersible resin include, for example, acrylic esters such as methyl (meth) acrylate, ethyl (meth) acrylate, isopropyl (meth) acrylate, n-propyl, (meth) acrylate, n-butyl (meth) acrylate, i-butyl (meth) acrylate, t-butyl (meth) acrylate, 2-ethylhexyl (meth) acrylate, n-octyl (meth) acrylate, lauryl (meth) acrylate, stearyl (meth) acrylate, tridecyl (meth) acrylate, cyclohexyl (meth) acrylate, butoxymethyl (meth) acrylate, ethoxydiethylene glycol (meth) acrylate, tetrahydrofurfuryl (meth) acrylate, isobornyl (meth) acrylate, benzyl (meth) acrylate, hydroxymethyl (meth) acrylate, 2-hydroxyethyl (meth) acrylate and 2-hydroxypropyl (meth) acrylate; styrene derivatives such as styrene, $\alpha$-methylstyrene, o-methylstyrene, m-methylstyrene, p-methylstyrene, p-t-butylstyrene and p-hydroxystyrene; itaconic esters such as benzyl itaconate; maleic esters such as dimethyl maleate; fumaric esters such as dimethyl fumarate; vinyl esters such as vinyl acetate, vinyl benzoate, vinyl versate and vinyl propionate; polymerizable nitriles such as (meth) acrylonitrile; (meth)acrylamide; and allyl alcohol.

As the polymerization method of the above described polymerizable monomer compositions, various methods such as block polymerization, solution polymerization and the like can be used, but the simple solution polymerization is preferable, and as the solvent to be used, an organic solvent is preferable. The organic solvent is not particularly limited so far as it can dissolve polymerizable monomers and obtained polymers, and includes, for example, aromatic hydrocarbons such as benzene, toluene and xylene; ketones such as acetone, methyl ethyl ketone and methyl isobutyl ketone and cyclohexanone; esters such as ethyl acetate and butyl acetate; alcohols such as methanol, ethanol and isopropyl alcohol. These organic solvents may be used by mixing two kinds or more. Among them, the solvent that makes phase inversion emulsification easy and relatively has compatibility with water is preferable, and the solvent having a low boiling point that is easy to remove the organic solvent after the phase inversion emulsification is preferably used. Such solvents include acetone, methyl ethyl ketone and ethyl acetate.

As the polymerization initiator used at the time of solution polymerization, any known radical polymerization initiator may be used, and for example there can be mentioned, azo compounds such as 2,2-azobisisobutyronitrile and 2,2-azobis(2,4-dimethylvaleronitrile; and peroxide compounds such as benzoyl peroxide, lauryl peroxide and t-butyl peroxy-2-ethylhexanoate.

As a synthesis method of anionic acrylic resins, in addition to the above described method in which acid groups are introduced at the time of polymerization, anionic groups can be introduced to the acrylic resin after polymerization, by for example, adding acid anhydride to a polymer having hydroxyl groups, and then neutralizing a necessary amount thereof with a base. Similarly, functional groups capable of reacting with a crosslinking agent may be introduced into the resin after polymerization. That is to say, any anionic acrylic resin having functional groups capable of reacting with a crosslinking agent may be optionally used as the self water-dispersible resin.

When an anionic polyester resin is used as the self water-dispersible resin, after polyester having acid groups is obtained by performing dehydration of dibasic acid and diol compound so that acid groups increase stoichiometrically, a necessary amount of this can be neutralized with a lbase, to thereby obtain the self water-dispersible resin. Alternatively, after polyester having acid groups is obtained by performing dehydration of dibasic acid and diol compound so that hydroxyl groups increase stoichiometrically, and adding acid anhydride thereto, the self water-dispersible resin can be obtained by neutralizing a necessary amount thereof with a base.

The dibasic acid serving as a material of the polyester resin includes, for example, succinic acid, adipic acid, azelaic acid, sebacic acid, dimer acid, terephthalic acid, dimethyl terephthalate, isophthalic acid, hexahydro terephthalate, hexahydro isophthalate, tetrohydrophthalic acid and 2,6-naphthalenedicarboxylic acid.

In addition, diol compounds serving as a material of the polyester resin includes, for example, ethylene glycol, neopentyl glycol, propylene glycol, diethylene glycol, dipropylene glycol, 2-methyl-1,3-propanediol, 2,2-diethyl-1,3-propanediol, 1,4-butanediol, 1,3-butanediol, 1,5-pentanediol, 1,6-hexanediol, 1,4-cyclohexandimethanol, alkylene oxide adduct of bisphenol A, alkylene oxide adduct of hydrogenated bisphenol A, polyethylene glycol, polypropylene glycol, polytetramethylene glycol, polycarbonate diol and polycaprolactone diol.

Moreover acid anhydride serving as a material of the polyester resin includes, for example, dibasic anhydrides such as phthalic anhydride, maleic anhydride, glutaric anhydride, tetrahydrophthalic anhydride, hexahydrophthalic anhydride, methyltetrahydrophthalic anhydride; and tribasic or tetrabasic anhydrides such as trimellitic anhydride and pyromellitic anhydride.

When polyester is obtained by means of dehydration of dibasic acid and diol compound, trihydric or more polybasic acids such as trimellitic acid and pyromellitic acid, or trihydric or more polyhydric alcohol compounds such as glycerine, trimethylolpropane and pentaerythritol may be used together, in a range that does not cause gelation.

Moreover, at the time of dehydration, if a known conventional esterification catalyst such as dibutyl tin oxide or the like is used, the intended reaction can be performed more smoothly.

If the functional group capable of performing cross-linking reactions with a crosslinking agent is a carboxyl group or a hydroxyl group, by neutralizing a necessary amount thereof with a base having a carboxyl group or having a carboxyl group and a hydroxyl group together, anionic polyester having a functional group capable of reacting with a crosslinking agent can be obtained. However, a functional group capable of reacting with a crosslinking agent may be introduced into the polyester obtained by means of dehydration. That is to say, any anionic polyester resin having a functional group capable of reacting with a crosslinking agent may be optionally used as the self water-dispersible resin used in the present invention.

When an anionic urethane resin is used as the self water-dispersible resin, after a urethane resin having acid groups is obtained by a condensation reaction of a diisocyanate compound, a diol compound and a diol compound having acid groups, a necessary amount of this may be neutralized with a base, to thereby obtain the self water-dispersible resin. When the functional group capable of performing cross-linking reactions with a crosslinking agent is a carboxyl group, a diol compound having a carboxyl group may be used as the diol compound having acid groups. When the functional group capable of performing cross-linking reactions with a crosslinking agent is a hydroxyl group, after a condensation reaction has been performed under a condition that the amount (mol) of the hydroxyl group of the diol compound and the diol compound haying acid groups exceeds the amount (mol) of the isocyanate group in the diisocyanate compound, the necessary amount of this may be neutralized with a base, to thereby obtain an anionic urethane resin having a hydroxyl group.

The diisocyanate compound serving as a material of the urethane resin includes, for example, aromatic diisocyanates such as 2,4-tolylenediisocyanate, 2,6-tolylenediisocyanate, m-phenylenediisoc,yanate, p-phenylenediisocyanate, 4,4-diphenylmethanediisocyanate, 2,4-diphenylmethanediisocyanate, 2,2-diphenylmethanediisocyanate, 3,3-dimethyl-4,4-biphenylenediisocyanate diphenylmethanediisocyanate, 3,3-dimethoxy-4,4-biphenylenediisocyanate, 3,3-dichloro-4,4-biphenylenediisocyanate, and 1,5-naphthalenediisocyanate; aliphatic diisocyanates or alicyclic diisocyanates such as 5-tetrahydronaphthalenediisocyanate, tetramethylenediisocyanate, 1,6-hexamethylenediisocyanate, dodecamethylenediisocyanate, lysinediisocyanate, 1,3-cyclohexylenediisocyanate, 1,4-cyclohexylenediisocyanate, isophoronediisocyanate, 4,4-dicyclohexylmethanediisocyanate, xylylenediisocyanate, tetramethylxylylenediisocyanate, trimethylhexamethylenediisocyanate, hydrogenated xylylenediisocyanate, and 3,3-dimethyl-4,4-dicyclohexylmethanediisocyanate.

When the isocyanate group is left at the terminal of the resin for internal crosslinking of the resin fine particles as described above, it is preferable to use aliphatic diisocyanates and alicyclic diisocyanates in which the reaction of the isocyanate group and water is relatively slow.

Moreover, the diol compounds serving as a material of the urethane resin include, for example, ethylene glycol, 1,2-propanediol (1,2-propylene glycol), 1,3-propanediol (1,3-propylene glycol), 1,3-butanediol, 1,4-butanediol (1,4-butylene glycol), neopentyl glycol, 1,6-hexanediol, 3-methyl-1,5-pentanediol, 1,8-octanediol, diethylene glycol, triethylene glycol, dipropane glycol, tripropylene glycol, cyclohexane-1,4-diol, and cyclohexane-1,4-dimethanol.

Furthermore, as the diol compounds serving as a material of the urethane resin, there can be used in addition to various diols, polyesterdiols which are a condensate with dibasic acid or dibasic anhydride such as succinic acid, adipic acid, glutaric acid, suberic acid, azelaic acid, sebacic acid, phthalic acid, isophthalric acid, terephthalic acid, glutaric anhydride, maleic acid, maleic anhydride and hexahydroisophthalic acid; polyester diols obtained by means of ring-opening polymerization of γ-butyrolactone or ε-caprolactone, using various diols as an initiator; polycarbonate diols such as poly(hexamethylene carbonate) diol; and polyetherdiols that are a ring-opened polymer of ethylene oxide, propylene oxide, butylenes oxide, styrene oxide or tetrahydrofuran singly or in combination of two or more of them, using one kind or at least two kinds of various diols as an initiator.

Copolymers of these diols may be used as the diol compound serving as a material of the urethane resin. These diol compounds may be used singly or in combination of various kinds thereof.

Moreover, the diol compounds having acid groups serving as a material of the urethane resin include, for example, 2,2-bis (hydroxymethyl) propionate and tartaric acid.

A small amount of polyol compound whose average functionality degree exceeds 2 may be used in the range that the urethane polymer is not gelated. Moreover, a small amount of polyisocyanate compound whose average functionality degree exceeds 2 may be used together.

Since the condensation reaction of the diisocyanate compound, the diol compound and the diol compound having acid groups increases viscosity, the solution reaction is preferable. The solvent to be used is not particularly limited, so long as it does not react with an isocyanate group. However, a solvent having a relatively high polarity which can favorably dissolve the obtained urethane resin is preferred, and considering that the solvent is removed in the post process, a solvent having higher vapor pressure than water is preferred. As such a solvent, there can be mentioned, for example, acetone, methyl ethyl ketone, ethyl acetate or the like.

Urethane condensation reaction can be performed without using any catalyst, but to promote the reaction and obtain the intended urethane resin in a short period of time, it is preferable to add a known conventional organic metallic catalyst.

The organic metallic catalyst includes, for example, cobalt naphthenate, zinc naphthenate, stannous chloride, stannic chloride, tetra-n-butyltin, tri-n-butyltin acetate, n-butyltin trichloride, trimethyltin hydroxide, dimethyltin dichloride, dibutyltin acetate, dibutyltin dilaurate or tin octenoate.

The functional group capable of performing cross-linking reactions with a crosslinking agent may be introduced, not at the same time with the resin synthesis, but after the synthesis, in the same manner as the anionic self water-dispersible acrylic resin and the anionic self water-dispersible polyester resin, and any anionic self water-dispersible resin having a functional group capable of performing cross-linking reactions with a crosslinking agent may be optionally used.

The resin into which these acid groups are introduced has preferably an acid value of from 5 to 300 (mg KOH/resin 1 g). If the acid value is less than 5, even if the resin is neutralized completely, it does not have self water-dispersibility, and if the acid value exceeds 300, synthesis is substantially impossible.

The photosensitive composition of the present invention is coated on a substrate and dried in a drying step. In this drying step, it is preferred that the glass-transition temperature of the resin fine particles of the present invention be not lower than 40° C. so that the resin fine particles do not cause heat denaturation such as fusion or the like with each other. Moreover, when it is necessary to preserve the resin for a long period of time at a high temperature, it is preferred that the glass-transition temperature of the resin fine particles of the present invention be not lower than 50° C. so that heat denaturation such as fusion or the like of the resin fine particles with each, other is not involved.

A resin having acid groups becomes a resin having self water-dispersibility by being neutralized with a base. In general, by neutralizing the resin in the range of the acid value of from 5 to 150, the resin becomes one having the self water-dispersibility. If the acid value for neutralizing with a base is less than 5, the dispersion stability in water is not sufficient, and if the acid value roughly exceeds 150, the resin is not dispersed in water and dissolved.

The base used for neutralization includes, for example, hydroxides of alkali metals such as sodium hydroxide and potassium hydroxide; amines such as triethylamine, tributylamine, triethanolamine and dimethylethanolamine; and aqueous ammonia.

The self water-dispersible resin having a functional group capable of performing cross-linking reactions with a crosslinking agent obtained in this manner is dispersed in water, to thereby obtain a dispersion of resin fine particles. At the time of phase inversion emulsification, since the viscosity of the system generally increases, and in view of the workability, it is preferred to use the self water-dispersible resin by diluting it with an organic solvent so that the solids become 5 to 60%. The organic solvent is not particularly limited so long as it dissolves the self water-dispersible resin. However, it is preferred to use an organic solvent having a relatively high compatibility with water, because it can disperse the resin stably. When the organic solvent is to be removed in the post process, it is preferred to use an organic solvent having a higher vapor pressure than water.

Such organic solvents include, for example, ketone-type solvents such as acetone and methyl ethyl ketone; ether-type solvents such as diethyl ether, dioxane and tetrahydrofuran; alcohol type solvents such as methanol, ethanol and isopropyl alcohol; ester-type solvents such as ethyl acetate; and halogen-type solvents such as dichloromethane. These organic solvents may be used singly or by mixing two kinds or more.

When the self water-dispersible resin is dispersed in water, a method in which water is added gradually to the self water-dispersible resin, to thereby obtain the dispersion of the resin fine particles through phase inversion emulsification is generally used, but depending on the case, the self water-dispersible resin solution may be added to water. In addition, water containing a neutralizer may be added to a resin having acid groups which is a precursor of the self water-dispersible resin, or a resin solution having acid groups which is a precursor of the self water-dispersible resin may be added to the water containing a neutralizer.

As a stirrer used at the time of dispersion, any known conventional device may be used, and the resin may be stirred with a normal stirrer, or with a disperser which gives a shear force such as an emulsifying disperser or the like. Generally, when fine particles of a small diameter of the order of sub-microns are prepared, it is preferred to use an emulsifying disperser having a high shear force, and when an encapsuling agent having a relatively large particle size of the Order of microns is prepared, it is preferred to use a stirrer which can stir gradually.

The resin fine particles obtained by the present method are those initially obtained as an aqueous dispersion containing an organic solvent, and may be used as they are, or may be used as an aqueous dispersion by decompressing and distilling the organic solvent, or may be used as a powder by removing the organic solvent and water content.

Crosslinking resin fine particles can be obtained by introducing a functional group for internal crosslink of particles into the self water-dispersible resin beforehand, and/or adding a crosslinking compound serving as a third component, and can be utilized for improving printing resistance and preservation stability, and for adjusting the sensitivity.

As a method for obtaining the crosslinking resin fine particles, for example, a urethane resin terminated by an isocyanate group is used as the self water-dispersible resin, and dispersed in water, to which a polyamine compound such as ethylenediamine, diethylenetriamine, tnethylenetetramine, tetraethylenepentamine or the like is added to three-dimensionally crosslink the particles, to thereby obtain the crosslinking resin fine particles. Alternatively, a multifunctional glycidyl compound such as N,N,N',N'-tetraglycidyl-m-xylylenediamine, bisphenol A-type epoxy resin, phenol-type epoxy resin, glycidyl methacrylate copolymer, glycidylester resin of carboxylic acid and alicyclic epoxy is used as the third component, and dispersed in water together with the self water-dispersible resin, after which heat is added thereto to three-dimensionally crosslink the particles, to thereby obtain the crosslinking resin fine particles. In this case, it is further preferable to remove the organic solvent before heat is added, since it can prevent fusion of the resin fine particles with each other. Alternatively, a urethane resin to which an isocyanate group is introduced beforehand is used as the self water-dispersible resin, and dispersed in water together with a hydrophobic polyisocyanate compound serving as a third component, after which a polyamine compound is added thereto to three-dimensionally crosslink the particles, to thereby obtain the crosslinking resin fine particles in which the crosslink density in the resin is enhanced. The method of crosslinking in the particles exemplified here covers only a part, and any known method of crosslinking in water may be used.

The suitable amount of the crosslinking functional group for crosslinking the particles is from 1.5 to 300 millimol (mmol) per 100 g of resin. If this is less than 1.5 millimol (mmol), the effect of crosslink cannot be obtained, and if this exceeds 300 millimol (mmol), the synthesis is substantially impossible.

The infrared absorption agent used in the present invention stands for a substance which absorbs light in the photosensitive composition layer and generates heat, and as such a substance, there can be mentioned, for example, various pigments or dyes.

As the pigment which can be used in the present invention, there can be used commercially available pigments and those pigments described in the Color Index Manual "Saishin Ganryou Binran" (Latest Pigment Manual) (edited by the Japan Pigment Technology Association, 1977), "Saishin Ganryou Ouyou Gijutsu" (Latest Pigment Applied Technology) (CMC Publishing, 1986), "Insatsu Inki Gijutsu" (Printing Ink Technology) (CMC Publishing, 1984), etc. The types of pigment include black pigments, yellow pigments, orange pigments, brown pigments, red pigments, violet pigments, blue pigments, green pigments, fluorescent pigments, and in addition, polymer bound coloring pigments. More specifically, there can be used insoluble azo pigments, azo lake pigments, condensed azo pigments, chelate azo pigments, phthalocyanine base pigments, anthraquinone base pigments, perylene and perinone base pigments, thioindigo base pigments, quinacridone base pigments, dioxazine base pigments, isoindolinone base pigments, quinophthalone base pigments, dye lake pigments, azine pigments, nitroso pigments, nitro pigments, natural pigments, fluorescent pigments, inorganic pigments, carbon black, etc. Among these specific examples, carbon black is particularly preferred as a substance which absorbs near infrared to infrared region light to efficiently generate heat, and is economically competitive. Moreover, grafted carbon blacks having excellent dispersibility and having various functional groups are commercially available, and there can be mentioned those described in, for example, "Carbon Black Manual, 3rd edition, (edited by the Carblon Black Association) 1995, p. 167", "Characteristics of Carbon Black and Optimal Formulation and Applied Technology (Technical Information Association) 1997, p. 111", etc. Any of these can be advantageously used in the present invention.

These pigments may be used without surface treatment or may be subjected to a known surface treatment. As the known surface treating method, there can be used a method including surface-coating a resin or wax, a method which attaches a surfactant, a method in which a reactive substance such as a silane coupling agent, an epoxy compound or polyisocyanate is bonded to the surface of a pigment, and so on. These surface treating methods are described in "Kinzoku Sekken no Seishitsu to Ouyou" (Properties of Metal Soaps and Their Application) (Saiwai Shobo), "Saishin Ganryou Ouyou Gijutsu" (Latest Pigment Applied Technology) (CMC Publishing, 1986), and "Insatsu Inki Gijutsu" (Printing Ink Technology) (CMC Publishing, 1984).

The particle diameter of the pigment used in the present invention is preferably in the range of from 0.01 to 15 $\mu$m, and more preferably in the range of from 0.01 to 5 $\mu$m.

As the dye which can be used in the present invention, there can be used any known conventional dyes and there can be mentioned, for example, those described in "Senryou Binran" (Dye Manual) (edited by the Organic Synthesis Chemistry Association, 1970), "Shikizai Kougaku Handobukku" (Coloring Material Engineering Handbook) (edited by the Coloring Material Association, Asakura Shoten, 1989), "Kougyouyou Shikiso no Gijutsu to Shijyou" (Technology and Market of Industrial Coloring Matter) (edited by CMC, 1983), and "Kagaku Binran Ouyou Kagaku Hen" (Chemistry Manual—Applied Chemistry Version)

(edited by Japan Chemistry Society, Maruzen Shoten, 1986). More specifically, there can be mentioned azo dyes, metal complex azo dyes, pyrazolone azo dyes, anthraquinone dyes, phthalocyanine dyes, carbonium dyes, quinoneimine dyes, methine dyes, cyanine dyes, indigo dyes, quinoline dyes, nitro dyes, xanthene dyes, thiazine dyes, azine dyes, and oxazine dyes. Among these specific examples, ones which absorb light of from a near infrared to infrared region are particularly preferred. The dyes which absorb near infrared light to infrared light include, for example, cyanine dyes described in Japanese Patent Unexamined Publications Nos. 58-125246, 59-84356, 59-202829, 60-78787, etc.; methane dyes described in Japanese Patent Unexamined Publications Nos. 58-173696, 58-181690, and 58-194595, etc.; naphthoquinone dyes described in Japanese Patent Unexamined Publications Nos. 58-112793, 58-224793, 59-48187, 59-73996, 60-52940, 60-63744, etc.; squarylium dyes described in Japanese Patent Unexamined Publications No. 58-112792; cyanine dyes described in United Kingdom Patent No. 434,875; infrared absorption agents described in U.S. Pat. No 5,156,938 and the like. Furthermore, there can be mentioned: substituted arylbenzo (thio)pyridinium salt described in U.S. Pat. No. 3,881,924; trimethinethiapyrylium salt described in Japanese Patent Unexamined Publications No. 57-142645; pyrylium compounds described in Japanese Patent Unexamined Publications Nos. 58-181051, 58-220143, 59-146063, and 59-146061; cyanine dyes described in Japanese Patent Unexamined Publications No. 59-216146; penamethinethio pyrylium salt described in U.S. Pat. No. 4,283,475; pyrylium compounds described in Japanese Patent Unexamined Publications Nos. 5-13514 and 5-19702; and infrared absorption dyes described in U.S. Pat. No. 4,756,993.

Among the above described pigments or dyes, at least one kind of a suitable pigment or dye that can absorb a specific wavelength from the high power light source described below and convert this to 49 heat can be selected, and added to the photosensitive composition layer for use.

When a pigment is used as the infrared absorption agent, the amount of pigment to be used is preferably in a range of from 1 to 70% by weight, and more preferably in a range of from 3 to 50% by weight, with respect to the total solids in the photosensitive composition layer. If the addediamount is less than I% by weight, even if light is absorbed to thereby generate heat, sufficient heat quantity for fusing and crosslinking the co-existing fine particles cannot be obtained and if the added amount is larger than 70% by weight, the heat quantity to be generated is too much, thereby causing a phenomena such as burning or rupture, and there is a tendency that it is difficult to forrn a fused latent image suitable for forming an image, which is not desirable.

When a dye is used as the infrared absorption agent, the amount of dye to be used is preferably in a range of from 0.1 to 30% by weight, and more preferably in a range of from 0.5 to 20% by weight, with respect to the total solids in the photosensitive composition layer. If the added amount is less than 0.1% by weight, even if light is absorbed to thereby generate heat, sufficient heat quantity for fusing the co-existing resin cannot be obtained, and if the added amount is larger than 30% by weight, the heat quantity to be generated reaches saturation, and there is a tendency: that the effect of addition is not exerted, which is not desirable.

The lithographic printing plate of the present invention can be produced by applying a coating solution of the photosensitive composition layer on a substrate, and then by drying the substrate. The coating solution of the photosensitive composition layer can be prepared by dispersing a pigment or a dye in a fine-particles dispersion and by mixing the dispersion with a crosslinking agent. The coating solution of the photosensitive composition layer can be also prepared by dispersing a pigment or a dye in water or a mixture solvent of water and an organic solvent, and then by mixing it with a fine-particles dispersion and a crosslinking agent. Also, the coating solution of the photosensitive composition layer can be prepared by dispersing a pigment or a dye in a self water-dispersible resin, and subjecting these to a phase inversion emulsification to thereby make fine particles containing a pigment or a dye therein (fine particles encapsulating a dye or a pigment), and mixing the fine particles with a crosslinking agent.

As a disperser used for dispersing a pigment or dye, any known conventional device may be used, and there can be mentioned, for example, an ultrasonic disperser, a sand mill, an attriter, a barrel mill, a super mill, a ball mill, an impeller, a disperser, a KD mill, a colloid mill, a dynatron, a three-roll mill, a pressure kneader and the like. In addition, at this time, an organic solvent may be used together, and in this case, an organic solvent having a low melting point which can be dissolved uniformly with water is particularly preferable. More specifically, there can be mentioned alcohols such as methanol, ethanol, n-propyl alcohol, isopropyl alcohol, n-butanol, s-butanol and t-butanol; ketones such as acetone, methyl ethyl ketone and methyl isobutyl ketone, esters such as ethyl acetate and butyl acetate; and aromatic hydrocarbons such as toluene and xylene.

Moreover resins that are soluble in alkaline aqueous solution, such as a phenol novolak resin or a (meth)acrylic resin, acid-generating agents and solubility-adjusting agents may be added according to need.

The coating solution of the photosensitive composition layer prepared in this manner may further contain various assistants for improving coatability. For example, in order to adjust the viscosity, there can be added various natural water-soluble polymers or synthetic water-soluble pol mers, water-soluble organic solvents such as methanol, ethanol, isopropyl alcohol, acetone, methyl ethyl ketone, ethyl acetate, ethylene glycol, propylene glycol, etc., and various surfactants.

The coating solution of the photosensitive composition is applied on a substrate by a known conventional method, preferably after the solids ratio in the coating solution has been adjusted to 1 to 50% by weight. As the coating method, there can be cited a rotary coating method by means of a spin coater or the like, a dip coating method, a roll coating method, a curtain coating method, a blade coating method, an air knife coating method, a spray coating method, a bar coater coating method, etc.

The coating solution of the photosensitive composition layer coated on the substrate in the above described manner is dried at a normal temperature, to thereby form the photosensitive coinposition layer. In order to dry this in a short period of time, it is preferred to dry the coating solution at 30 to 150° C. for 10 seconds to 10 minutes using a hot air drier, infrared drier, etc.

The photosensitive layer of the lithographic printing plate of the present invention is stripped of its non-image portion by a wet method, after images are inscribed with a high power laser of the near infrared to infrared region. The developer used for the development treatment is an acid aqueous solution or an alkaline aqueous solution. Considering corrosion of the base materials, it is generally preferred to use an alkaline aqueous solution using an alkali agent. As the high power laser of the near infrared to infrared region, there can be mentioned various lasers having the maximum strength in the near infrared to infrared region of from 760 nm to 3000 nm, for example, a semiconductor laser, YAG laser, etc.

Below is a description of a case where the present invention is applied to a lithographic printing plate.

When the, present invention is applied to a lithographic printing plate, a photosensitive layer has only to be provided on a substrate having a hydrophilic surface. That is to say, by applying a coating solution of the photosensitive composition layer on a substrate having a hydrophilic surface and drying the coating solution, as described above, a lithographic printing plate can be prepared.

As such a substrate, there can be mentioned, for example, plates of metal such as aluminum, zinc, copper, stainless steel, iron, etc.; films of plastics such as polyethylene terephthalate (PET), polycarbonate, polyvinyl acetal, polyethylene, etc.; a composite material such as paper or plastic film which has been solution coated with a synthetic resin or which has been coated with a synthetic resin solution and which is provided with a metal layer by vacuum deposition, lamination or similar technology; and the like. Of these, particularly preferred are an aluminum substrate and a composite substrate covered with aluminum.

The surface of the aluminum substrate is desirably surface-treated for the purpose of increasing water retention and improving the adhesion with the photosensitive layer. As such a surface treatment method, for example, surface roughening methods include a brush polishing method, a ball polishing method, electrolytic etching, chemical etching, liquid honing, sand blasting and combinations of these. A surface roughening method including the use of electrolytic etching is particularly preferred.

The electrolytic bath used upon electrolytic etching includes aqueous solutions containing an acid, an alkali or their salts or an aqueous solution containing an organic solvent. Of these, particularly preferred are those electrolytes containing hydrochloric acid, nitric acid or their salts. Further, aluminum plates subjected to surface roughening treatment, if desired, may be subjected to desmutting treatment with an aqueous solution of acid or alkali. The aluminum plate thus obtained is desirably anodized and a method is desirable which uses for the treatment a baih containing sulfuric acid or phosphoric acid.

Further, if desired, there can be carried out various treatments, for example, a silicate treatment (sodium silicate, potassium silicate) as described in U.S. Pat. Nos. 2,714,066 and 3,181,461, a potassium zirconium fluoride treatment as described in U.S. Pat. No. 2,946,63 8, a phosphomolybdate treatment as described in U.S. Pat. No. 3,201,247, alkyl titanate treatment as described in United Kingdom Patent No. 1,108,559, a polyacrylic acid treatment as described in German Patent No. 1,091,433, a polyvinylphosphonic acid treatment as described in Gerrnan Patent No. 1,134,093 and United Kingdom Patent No. 1,230,447, a phosphonic acid treatment as described in Japanese Patent Publication No. 44-6409, a phytic acid treatment as described in U.S. Pat. No. 3,307,951, a treatment with a salt of a hydrophilic organic high molecular compound and a divalent metal as described in Japanese Patent Unexamined Publication Nos. 58-16839, 58-18291, a hydrophilic treatment by undercoating a water-soluble polymer having a sulfonic acid group as described in Japanese Patent Unexamined Publication No. 59-101651, a coloring treatment with an acid dye as described in Japanese Patent Unexamined Publication No. 60-64352, a silicate electrodeposition treatment as described in U.S. Pat. No. 3,658,662, etc.

It is also preferred that the substrates are subjected to sealing treatment for sealing pore cavities after 'sand blasting and anodizing. The sealing treatment can be carried out by dipping in a hot aqueous solution containing hot water and inorganic salt or organic salt and steam bath, etc.

Next, the method for preparing a printing plate using the lithographic printing plate of the present invention will be described.

The lithographic printing plate of the present invention is a so-called computer-to-plate (CTP) plate, which allows direct image inscription onto the plate using a high power laser based on digital image information from a computer or the like. The high power laser which can form images on the lithographic printing plate of the present invention includes various semiconductor lasers, YAG laser, etc. In each case, such an optical source can be used by selecting a pigment which can absorb light with a specified wavelength of the optical source to be used and convert it to heat, from among the above-described pigments or dyes and adding the selected pigment or dye to the photosensitive composition layer.

The photosensitive composition layer in the lithographic printing plate of the present invention is stripped of its non-image portion by a wet method in the development treatment after images are inscribed with the high power laser. The developer used at this time is an alkaline aqueous solution containing an alkali agent, when the resin constituting the resin fine particles having a functional group capable of performing cross-linking reactions with a crosslinking agent contained in the photosensitive composition layer has an anionic group.

The alkali agent used in the developer for the lithographic printing plate of the present invention includes, for example, an inorganic alkali compound such as sodium silicate, potassium silicate, sodium hydroxide, potassium hydroxide, lithium hydroxide, sodium secondary or tertiary phosphate, potassium or ammonium salt, sodium metasilicate, sodium carbonate, ammonium, etc.; and an organic alkali compound such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine, ethylenediamine, etc.

The content of the alkali agent in the developer is preferably in a range of from 0.005 to 10% by weight, and more preferably in a range of from 0.05 to 5% by weight. If the content of the alkali agent in the developer is less than 0.005% by weight, development fails while a content above 100% by weight adversely affects the image forming layer, such as by corrosion upon development and is thus not desirable.

The developer of the lithographic printing plate of the present invention may contain an organic solvent, specific examples of which include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol benzyl ether, ethylene glycol monophenyl ether, benzyl alcohol, methyl phenyl carbitol, n-amyl alcohol, methylamyl alcohol, xylene, methylene dichloride, ethylene dichloride, monochlorobenzene, etc.

The amount of the organic solvent to be added at the time of adding the organic solvent to the developer is preferably not higher than 20% by weight, and more preferably, not higher than 10% by weight.

Furthermore, according to need, the developer may contain water-soluble sulfite such as lithium sulfite, sodium sulfite, potassium sulfite, magnesium sulfite, etc.; hydroxy aromatic compounds such as alkali-soluble pyrazolone compound, alkali-soluble thiol compound and methyl resorcin.; water softeners such as polyphosphate and amino polycarboxylic acid; various surfactants such as anionic surfactant, nonionic surfactant, cationic surfactant, ampholytic surfactant and fluorochemical surfactant, including sodium isopropylnaphthalenesulphonate, sodium n-butylnaphthalenesulphonate, sodium N-methyl-Npentadecylaminoacetate, and sodium laurylsulfate; and various defoaming agents.

As for the developer used for the image forming method of the present invention, one having the above described composition is used, and practically, commercially available developers for negative-type PS plates or positive-type PS plates can be used. The commercially available concentrated type developers for negatives or positives can be used as the developer for the lithographic printing plate of the present invention after I to 1000 fold dilution.

The lithographic printing plate of the present invention is dipped in the developer, and washed with water, after an image has been formed thereon by using a laser beam. The temperature of the developer is preferably from 15 to 40° C., and the dipping time is preferably from 1 second to 2 minutes. The surface may be rubbed off during development, according to need.

The lithographic printing plate of the present invention after the development, is subjected to washing with water and/or treatment with an aqueous desensitizer. As the aqueous desensitizer, there can be cited water-soluble natural polymers such as gum Arabic, dextrin, and carboxymethylcellulose; water-soluble synthetic polymers such as polyvinyl alcohol, polyvinylpyrrolidone, and polyacrylic acid. If desired, acids, surfactants, etc. may be added to the aqueous desensitizers. After being subjected to the treatment by means of the desensitizer, the lithographic printing plate is dried and used for printing as a printing plate.

The above printing plate may be subjected to a burning treatment to prepare the printing plate for the purpose of increasing the printing resistance of the obtained printing plate. The burning treatment is performed according to the following steps. (1) First, the printing plate obtained by the treatment process described above is washed with water, and squeegeed after the rinse solution and rubber solution have been removed. (2) Then, a surface smoothing solution is uniformly spread over the plate, and dried. (3) The plate is then burned in an oven at a temperature of from 180 to 300° C. for 1 to 30 minutes. (4) After the plate is cooled, the surface smoothing solution is removed by washing with water, and gummed and dried, to thereby prepare a printing plate.

The surface smoothing solution is solely used as an aqueous solution for processing prior to the burning processing, so that greasing is not caused after the burning processing. Various acids, alkali or salts are added thereto in order to maintain as the main component, a surfactant, particularly preferably being an anionic surfactant and/or a fluorochemical surfactant, in the range of from 0.005 to 30% by weight, and with a pH in the range of from 2 to 11, and preferably 3 to 10.

The anionic surfactant used in the surface smoothing solution includes, for example, surfactants having; a sulfonic group such as alkylbenzene sulfonate, alkyldiphenyl ether disulfonate, alkylnaphthalene sulfonate, aldehyde condensate of alkylnaphthalene sulfonate, α-olefin sulfonate and alkyl sulfonate; and sulfate based surfactant such as lauryl sulfate, polyoxyethylene alkylether sulfate and polyoxyethylene alkylphenylether sulfate.

The fluorchemical surfactant used in the surface smoothing solution includes, for example, anionic fluorochemical surfactant such as carboxylate having a perfluoroalkyl group, sulfonate having a perfluoroalkyl group, sulfate having a perfluoroalkyl group and phosphate having a perfluoroalkyl group; cationic fluorochemical surfactant such as amine salt having a perfluoroalkyl group and quartemary ammonium salt having a perfluoroalkyl group; ampholytic fluorochemical surfactant such as perfluoroalkylcarboxy betaine, and aminocarboxylate having a perfluoroalkyl group; and nonionic fluorochemical surfactant such as oligomer having a perfluoroalkyl group, polymer having a perfluoroalkyl group, and sulfonamide polyethylene glycol adduct having a perfluoroalkyl group.

The acid used in the surface smoothing solution includes, for example, mineral acids such as nitric acid, sulfuric acid and phosphoric acid, citric acid, succinic acid, oxalic acid, tartaric acid, acetic acid, malic acid, phytic acid, organic phosphonic acid, p-toluene sulfonate, and xylene sulfonate. Moreover, lithium salt, sodium salt, potassium salt and ammonium salt of these acids, or hydroxides, carbonates and hydrogen carbonates of alkali metals can be also used for the surface smoothing solution.

Furthermore, the surface smoothing solution may contain a high molecular compound having a film forming ability, which is a natural product, denaturation of a natural product or a synthetic high molecular polymer, in an amount of 0.0001 to 3% by weight. Moreover, preservatives, an antifoaming agent, a coloring agent or the like may be added to the surface smoothing solution.

A preferred method for preparing a good printing plate using the lithographic printing plate of the present invention is to first attach the lithographic printing plate of the present invention to an image exposure machine using a high power laser such as YAG laser, infrared semiconductor laser, etc., as an optical source and directly inscribe images based on digital information from alcomputer on the lithographic printing plate of the present invention. After this a developing processing with a developer is performed to remove a non-image portion. Thereafter, the lithographic printing plate is subjected to washing with water and/or treatment with an aqueous desensitizer, and then dried to thereby obtain a printing plate. The series of development processing steps may be performed step by step, but practically, it is easier and more preferable to use an automatic developing machine that can perform these steps continuously. On this occasion, the lithographic printing plate of the present invention has the feature that it does not require any special safety light for handling it before or after exposure but can be operated under normal room light. Moreover, with a conventional lithographic printing plate, after an image has been inscribed, heating processing is performed prior to development to thereby form a latent image. However, the lithographic printing plate of the present invention also has a feature in that heating processing is not required after inscribing the image. The photosensitive composition of the present invention can be used for various applications in addition to the printing plate.

EXAMPLE

The present invention will be described in more detail by way of examples. However, the present invention is not construed as being limited thereto.

In the following examples, the dry solids ratio was expressed by measuring a weight ratio of a sample of 1 g before and after the sample was dried at 130° C. for 1 hour. The number average molecular weight was measured by gel permeation chromatography (hereinafter referred to as "GPC"), and expressed in molecular weight terms of polystyrene. The acid value was determined by weighing a predetermined amount of a sample solution and titrating with a methanol solution of potassium hydroxide at a known concentration. Moreover, the particle diameter of the resin fine particles was measured by a laser Doppler type particle size analyzer MICROTRAC UPA-150.

Synthesis Example 1

(Synthesis Example of an Acrylic Resin)

In a 1L four-necked flask equipped with a stirrer, a condenser, a dry nitrogen introduction pipe with a thermometer, and a dripping apparatus was charged 400 g of methyl ethyl ketone and the temperature was elevated to 80° C. A well mixed solution of 80 g of styrene, 253.44 g of methyl methacrylate, 51.32 g of acrylic acid, 15.24 g of butyl methacrylate, and 8 g of PERBUTYL-O (trade name for a polymerization initiator manufactured by Nippon Oil & Fats Co., Ltd.) was then dripped into this over 2 hours. After dripping, stirring was continued for an6 ther 15 hours, to thereby obtain an acrylic resin having a dry solids ratio of 49.5%, an acid value of 50.1, and a number average molecular weight of 18,000. Hereinafter, this acrylic resin is referred to as "acrylic resin (1)".

Synthesis Example 2

(Synthesis Example of an Acrylic Resin)

In a 1L four-necked flask equipped with a stirrer, a condenser, a dry nitrogen introduction pipe with a thermometer, and a dripping apparatus was charged 400 g of methyl ethyl ketone and the temperature was elevated to 80° C. A well mixed solution of 80 g of styrene, 205.92 g of methyl methacrylate, 41.04 g of acrylic acid, 45.04 g of butyl acrylate, 28 g of 2-hydroxyethyl methacrylate and 8 g of PERBUTYL-O (trade name for a polymerization initiator manufactured by Nippon Oil & Fats Co., Ltd.) was then dripped into this over 2 hours. After dripping, sti rring was continued for another 15 hours, to thereby obtain an acrylic resin having a dry solids ratio of 49.8%, an acid value of 40.2, and a number average molecular weight of 21,000. Hereinafter, this acrylic resin is referred to as "acrylic resin (2)".

Synthesis Example 3

(Synthesis Example of Acrylic Resin Fine Particles) 100 g of a solution of the above-described acrylic resin (1) was neutralized with 26.7 g of aqueous solution of 1.0M sodium hydroxide, and water was dripped. The resin solution increased its viscosity slowly and when about 150 g of water was dripped, the viscosity decreased abruptly, which indicated that the phase inversion was completed. After further addition of 150 g of water, the resulting dispersion was heated to 30° C. and the organic solvent and excess water were removed under reduced pressure to obtain a concentrate. Water was added to the concentrated resin solution to thereby adjust the dry solids ratio to 30%. Hereinafter, this is designated as water dispersion of acrylic resin fine particles (A). The average particle diameter thereof was 0.2 μm.

Synthesis Example 4

(Synthesis Example of Acrylic Resin Fine Particles) 100 g of a solution of the above-described acrylic resin (2) was neutralized with 26.7 g of aqueous solution of 1.0M sodium hydroxide, and water was dripped. The resin solution increased its viscosity slowly and when about 150 g of water was dripped, the viscosity decreased abruptly, which indicated that the phase inversion was completed. After further addition of 150 g of water, the resulting dispersion was heated to 30° C. and the organic solvent and excess water were removed under reduced pressure to obtain a concentrate. Water was added to the concentrated resin solution to thereby adjust the dry solids ratio to 30%. Hereinafter, this is designated as water dispersion of acrylic resin fine particles (B). The average particle diameter thereof was 0.07 μm.

Synthesis Example 5

(Synthesis Example of Acrylic Resin Fine Particles)

To a solution obtained by mixing well 100 g of a solution of the above-described acrylic resin (1), 0.89 g of "TETRAD-X" (trade name for a polyglycidyl compound manufactured by Mitsubishi Gas Chemical Co. Inc.) and 26.7 g of aqueous solution of 1.0M sodium hydroxide, water was dripped slowly. The resin solution increased its viscosity slowly and when about 150 g of water was dripped, the viscosity decreased abruptly, which indicated that the phase inversion was completed. After further addition of 150 g of water, the resulting dispersion was heated to 30° C. and the organic solvent and excess water were removed under reduced pressure, and the dispersion was heated again to 80° C. and stirring was continued for 4 hours. Water was added thereto to thereby adjust the dry solids ratio to 30% to thereby obtain an aqueous dispersion of acrylic crosslinking resin fine particles (C) having an average particle diameter of 0.25 μm.

Synthesis Example 6

(Synthesis Example of Polyester Resin Fine Particles)

In a 2 L four-necked flask equipped with a stirrer, a rectifying tube, a dry nitrogen introduction pipe and a thermometer were charged 397.6 g of terephthalic acid, 397.6 g of isophthalic acid, 144.9 g of ethylene glycol and 243.6 g of neopentyl glycol, and the temperature was elevated to 160° C. 0.5 g of dibutyltin oxide was added thereto, and the mixture was subjected to a dehydration reaction, while elevating the temperature to 260° C. over 6 hours. Thereafter, the rectifying tube was changed to a decanter and 30 g of xylene was added thereto. While water was removed by azeotropic distillation, stirring was continued for another 4 hours. After subjecting to radiational cooling, the content was diluted with 500 g of methyl ethyl ketone to thereby obtain a polyester resin having an acid value of 19.3, and a dry solids ratio of 65.5%.

To 100 g: of the above described polyester solution was added 30 g of methyl ethyl ketone, and after the mixture was neutralized with 2.36 g of triethylamine, and while stirring, water was dripped. The resin solution increased its viscosity gradually, and when about 150 g of water was dripped, the viscosity decreased abruptly, which indicated that the phase inversion was completed. After further addition of 150 g of water, the resulting dispersion was heated to 30° C. and the organic solvent and excess water were removed under reduced pressure to obtain an aqueous dispersion of polyester resin fine particles (D) having a dry solids ratio of 30% and an average particle diameter of 0.30 μm.

Synthesis Example 7

(Synthesis Example of Urethane Crosslinking Resin Fine Particles)

In a 1L four-necked flask equipped with a stirrer, a condenser, a dry nitrogen introduction pipe and a thermometer were charged 533 g of "BURNOCK DN-980" (trade name for polyisocyanate manufactured by Dainippon Ink and Chemicals, Inc.), 33.5 g of 2,2-bis(hydroxymethyl) propionic acid, 0.05 g of dibutyltin dilaurate, and 300 g of ethyl acetate and stirred at 80° C. for 3 hours to obtain a solution of a polyurethane prepolymer having a dry solids ratio of 50.0%, and an NCO content of 6.80%.

To 100 g of the above-described polyurethane prepolymer solution was added 30 g of methyl ethyl ketone, the mixture was neutralized with 3.50 g of triethylamine, and while stirring, water was dripped. The prepolymer solution increased its viscosity slowly and when about 150 g of water was dripped, the viscosity decreased abruptly, which indicated that the phase reversal was completed. After further addition of 150 g of water, an aqueous solution of 2.51 g of diethylenetriamine in 50 g of water was slowly added while stirring. Then, the resulting dispersion was heated to 30° C. and the organic solvent and excess water were removed under reduced pressure to obtain an aqueous dispersion of polyurethane fine particles having a dry solids ratio of 33.5% and an average particle diameter of 0.078 μm. This aqueous solution was diluted with water so as to have a dry solids ratio of 30%. Hereinafter, this solution is designated as an aqueous dispersion of urethane resin fine particles (E).

Synthesis Example 8

(Synthesis Example of Alkali-soluble Crosslinking Agent)

In a 500 mL four-necked flask equipped with a stirrer, a thermometer, a reflux condenser pipe and a dry nitrogen introduction pipe were charged 71.2 g of 2-(4,6-diamino-1,3,5-triazine-2-yl) benzoic acid, 154.3 g of 37% formaldehyde aqueous solution and 133.2 g of n-butanol, and the mixture was heated at 80° C. for 30 minutes. Then, the reflux condenser pipe was changed to a decanter, and water was removed over 4 hours, while water and n-butanol were subjected to azeotropic distillation under reduced pressure. Then, 100 g of methylisobutyl ketone (hereinafter, abbreviated to MIBK) was added thereto, and the solvent was removed under reduced pressure to obtain an alkali-soluble crosslinking agent. This crosslinking agent was diluted with methyl ethyl ketone (hereinafter, abbreviated to MEK), to thereby obtain a solution of alkali-soluble crosslinking agent having a dry solids ratio of 40%. Hereinafter, this crosslinking agent is designated as alkali-soluble crosslinking agent (a).

Synthesis Example 9

(Synthesis Example of Alkali-soluble Crosslinking Agent)

In a 500 mL four-necked flask equipped with a stirrer, a thermometer, a reflux condenser pipe and a dry nitrogen introduction pipe were charged 23.8 g of 2-(4,6-diamino-1,3,5-triazine-2-yl) benzoic acid, 18.7 g of benzoguanamine, 68.6 g of 37% formaldehyde aqueous solution and 88.8 g of n-butanol, and the mixture was heated at 80° C. for 30 minutes. Then, the reflux condenser pipe was changed to a decanter, and water was removed over 4 hours, while water and n-butanol were subjected to azeotropic distillation under reduced pressure. Then, 50 g of MIBK was added thereto, and the solvent was removed under reduced pressure to obtain an alkali-soluble crosslinking agent. This crosslinking agent was diluted with MEK, to thereby obtain a solution of alkali-soluble crosslinking agent having a dry solids ratio of 40%. Hereinafter, this crosslinking agent is designated as alkali-soluble crosslinking agent (b).

Synthesis Example 10

(Synthesis Example of Alkali-soluble Crosslinking Agent)

In a 500 mL four-necked flask equipped with a stirrer, a thermometer, a reflux condenser pipe and a dry nitrogen introduction pipe were charged 7.1 g of 2-(4,6-diamino-1,3,5-triazine-2-yl) benzoic acid, 31.8 g of benzoguanamine, 68.6 g of 37% formaldehyde aqueous solution and 88.8 g of n-butanol, and the mixture was heated at 80° C. for 30 minutes. Then, the reflux condenser pipe was changed to a decanter, and water was removed over 4 hours, while water and n-butanol were subjected to azeotropic distillation under reduced pressure. Then, 50 g of MIBK was added thereto, and the solvent was removed under reduced pressure to obtain an alkali-soluble crosslinking agent. This crosslinking agent was diluted with MEK, to thereby obtain a solution of alkali-soluble crosslinking agent having a dry solids ratio of 40%. Hereinafter, this crosslinking agent is designated as alkali-soluble crosslinking agent (c).

Synthesis Example 11

Synthesis Example of Alkali-soluble Crosslinking Agent)

In a 500 inL four-necked flask equipped with a stirrer, a thermometer, a reflux condenser pipe and a dry nitrogen introduction pipe were charged 37.4 g of benzoguanamine, 2.8 g of glyoxylic acid monohydrate and 88.8 g of n-butanol, and the mixture was heated at 80° C. for 30 minutes. Then, the reflux condenser pipe was changed to a decanter, and water was removed over 4 hours, while water and n-butanol were subjected to azeotropic distillation under reduced pressure. Then, 50 g of MIBK was added thereto, and the solvent was removed under reduced pressure to obtain an alkali-soluble crosslinking agent. This crosslinking agent was diluted with MEK, to thereby obtain a solution of alkali-soluble crosslinking agent having a dry solids ratio of 40%. Hereinafter, this crosslinking agent is designated as alkali-soluble crosslinking agent (d).

Synthesis Example 12

(Synthesis Example of Alkali-soluble Crosslinking Agent)

In a 500 mL four-necked flask equipped with a stirrer, a thermometer, a reflux condenser pipe and a dry nitrogen introduction pipe were charged 25.2 g of melamine, 3.0 g of glyoxylic acid monohydrate and 118.4 g of n-butanol, and the mixture was heated at 80° C. for 30 minutes. Then, 100.3 g of 37% formaldehyde aqueous solution was added thereto and heated for 30 minutes. Thereafter, the reflux condenser pipe was changed to a decanter, and water was removed over 4 hours, while water and n-butanol were subjected to azeotropic distillation under reduced pressure. Then, 50 g of MIBK was added thereto, and the solvent was removed under reduced pressure to obtain an alkali-soluble crosslinking agent. This crosslinking agent was diluted with MEK, to thereby obtain a solution of alkali-soluble crosslinking agent having a dry solids ratio of 40%. Hereinafter, this crosslinking agent is designated as alkali-soluble crosslinking agent (e).

Synthesis Example 13

(Synthesis Example of Polymethyl Methacrylate Fine Particles)

In a 500 mL four-necked flask equipped with a stirrer, a therrnometer, a reflux condenser pipe and a dry nitrogen introduction pipe were charged 200 g of water, 0.2 g of Newcol-560SF (trade name for emulsifier manufactured by Nippon Nyukazai Co., Ltd.), and 0.2 g of methyl methacrylate, and the mixture was stirred at 80° C. for 30 minutes. Then, a mixture of 100 g of methyl methacrylate and 0.8 g of Newcol-560SF was dripped over 2 hours. Thereafter, the mixture was stirred at 80° C. for 6 hours. This mixture was diluted with water, to thereby obtain an aqueous dispersion of polymethyl methacrylate fine particles (F) having an average particle diameter of 0.1 μm and a dry solids ratio of 20%.

Example 1

40 g of the aqueous dispersion of acrylic resin fine particles (C) obtained in the Synthesis Example 5,3 g of "Carbon Black MA-100" (carbon black manufactured by Mitsubishi Chemical Corp.), 37 g of water and 20 g of isopropyl alcohol were mixed well. 180 g of 1 mm glass beads was added thereto and dispersed therein by a paint conditioner for 1 hour. Then, the glass beads were filtered and removed, to thereby obtain a solution of acrylic resin fine particlesicontaining carbon black dispersed therein. 20 g of this solution, 0.75 g of "NIKALAC NW-30" (trade name for methylated melamine manufactured by Sanwa Chemical Co., Ltd.), 43 g of water and 11 g of isopropyl alcohol were then mixed well, to thereby obtain a coating solution.

The surface of an aluminum plate in a B4 wide size having a thickness of 0.3 mm was sand blasted by using a nylon brush and an aqueous suspension of pumice stone of 400 meshes, and then anodized in an electrolyte containing 20% sulfuric acid at a current density of $2A/dm^2$. After an oxide film of 2.7 $g/m^2$ was formed, the aluminum plate was washed with water and dried to thereby obtain a substrate.

The substrate was coated with the aforementioned coating solution by using a No. 14 bar coater, and dried at 60° C. for 4 minutes, to thereby obtain a lithographic printing plate of the present invention.

By using this lithographic printing plate, an image exposure was performed, while changing the exposure dose by means of a test exposure machine mounted with a near infrared-ray semiconductor laser (wavelength: 808 nm, power: 1W, manufactured by Line Electron Co., Ltd.). The bore diameter of the laser at an intensity $1/e^2$ of the peak was 20 μm. After the image exposure, the plate was dipped, using a 1:99 diluted solution of a developer for positive PS plates "PD-1" (manufactured by Polychrome Japan Co., Ltd.) at 30° C. for 30 seconds to effect development, and washed with water and dried. The sensitivity thereof was 180 $mJ/cm^2$, and a non-image portion was peeled off clearly. After the lithographic printing plate was heated at 60° C. for 15 hours, no change was seen in the sensitivity after the accelerated preservation stability test, and blurs in the non-image portion were not seen.

Examples 2 to 7

A lithographic printing plate was prepared in the same manner as in Example 1, except that the resin fine particles and the crosslinking agent in Example 1 were changed to those shown in Table 1, and evaluated in the similar manner. The results are shown in Table 2 collectively. Incidentally, in Table 1, MW-30 stands for "NIKALAC MW-30" (trade name for methylated melamine manufactured by Sanwa Chemical Co., Ltd.), and MX-45 stands for "NIKALAC MX-445" (trade name for methyl-butyl mixed etherified melamine manufactured by Sanwa Chemical Co., Ltd.).

TABLE 1

| | Resin fine particles | MW-30 | MX-45 |
|---|---|---|---|
| Example 1 | A | 0.75 g | — |
| Example 2 | A | — | 0.75 g |
| Example 3 | B | 0.75 g | — |
| Example 4 | B | — | 0.75 g |
| Example 5 | C | 0.75 g | — |
| Example 6 | D | 0.75 g | — |
| Example 7 | E | 0.75 g | — |

Example 8

To 100 g of the solution of the acrylic resin (1) obtained in the Synthesis Example 1 was added 2.5 g of "YKR-3070" (trade name for the infrared absorption coloring matter manufactured by Yamamoto Kasei Co., Ltd.) and mixed well. This mixture solution was neutralized with 26.7 g of aqueous solution of 1.0M sodium hydroxide, and then water was dripped thereto. The resin solution increased its viscosity slowly and when about 150 g of water was dripped, the viscosity decreased abruptly, which indicated that the phase inversion was completed. After further addition of 150 g of water, the resulting dispersion was heated to 30° C. and the organic solvent and excess water were removed under reduced pressure to obtain an aqueous dispersion of acrylic resin fine particles containing an infrared absorption coloring matter having an average particle diameter of 0.2 μm. Water was further added thereto, to adjust the dry solids ratio to 30%.

To 10 g of this aqueous dispersion were mixed well 0.75 g of "NIKALAC NW-30" (trade name for methylated melamine manufactured by Sanwa Chemical Co., Ltd.), 49 g of water and 15 g of isopropyl alcohol to thereby obtain a coating solution. The coating solution was coated on the substrate obtained in a similar step as in Example 1 by using a No. 18 bar coater, and dried at 60° C. for 4 minutes, to thereby obtain a lithographic printing plate of the present invention.

By using this lithographic printing plate, an image exposure was performed, while changing the exposure dose by means of a test exposure machine mounted with a near infrared-ray semiconductor laser (wavelength: 808 nm, power: 1W, manufactured by Line Electron Co., Ltd.). After the image exposure, the plate was dipped, using a 1:99 diluted solution of a developer for positive PS plates "PD-1" (manufactured by Polychrome Japan Co., Ltd.) at 30° C. for 30 seconds to effect development, and washed with water and dried. The sensitivity thereof was 190 $mJ/cm^2$, and a non-image portion was peeled off clearly. After the lithographic printing plate was heated at 60° C. for 15 hours, no change was seen in the sensitivity after the accelerated preservation stability test, and blurs in the non-image portion were not seen.

Comparative Examples 1

24 g of acrylic resin (1) obtained in the Synthesis Example 1,3 g of "Carbon Black MA-100" (carbon black manufactured by Mitsubishi Chemical Corp.), and 23 g of methyl ethyl ketone were mixed well. 90 g of 1 mm glass beads was added thereto and dispersed therein by a paint conditioner for 1 hour. Then, the glass beads were filtered and removed, to thereby obtain a solution of acrylic resin containing carbon black dispersed therein. 10 g of this solution and 0.75 g of "NIKALAC NW-30" (trade name for methylated melamine manufactured by Sanwa Chemical Co.; Ltd.) were mixed well, and diluted with 49 g of methyl ethyl ketone to thereby obtain a coating solution. The substrate obtained in a similar step as in Example 1 was coated with the coating solution by using a No. 20 bar coater, and dried at 60° C. for 4 minutes, to thereby obtain a lithographic printing plate. The dried coating quantity was 2.0 $g/m^2$. The lithographic printing plate was dipped in a 1:9 diluted solution of the developer for positive PS plates "PD-1" (manufactured by Polychrome Japan Co., Ltd.) at 30° C. for 30 seconds, but no peeling was effected.

Comparative Example 2

24 g of acrylic resin (2) obtained in the Synthesis Example 2,3 g of "Carbon Black MA-100" (carbon black manufactured by Mitsubishi Chemical Corp.), and 23 g of methyl ethyl ketone were mixed well. 90 g of 1 mm glass beads was added thereto and dispersed therein by a paint conditioner: for 1 hour. Then, the glass beads were filtered and removed, to thereby obtain a solution of acrylic resin containing carbon black dispersed therein. 10 g of this solution and 0.75 g of "NIKALAC NW-30" (trade name for methylated melamine manufactured by Sanwa Chemical Co., Ltd.) were mixed well, and diluted with 50 g of methyl ethyl ketone to thereby obtain a coating solution. The substrate obtained in a similar step as in Example 1 was coated with the coating solution by using a No. 18 bar coater, and dried at 60° C. for 4 minutes, to thereby obtain a lithographic printing plate. The dried coating quantity was 2.0 g/m$^2$.

By using this lithographic printing plate, an image exposure was performed, while changing the exposure dose by means of a test exposure machine mounted with a near infrared-ray semiconductor laser (wavelength: 808 nm, power: 1W, manufactured by Line Electron Co., Ltd.). After the image exposure, the plate was dipped, using a 1:99 diluted solution of a developer for positive PS plates "PD-1" (manufactured by Polychrome Japan Co., Ltd.) at 30° C. for 30 seconds to effect development, and washed with water and dried. With this plate, both the image portion and the non-image portion were not peeled off, and an image could not be formed. Moreover, the plate was dipped, using a 1:9 diluted solution of a developer for positive PS plates "PD-1" at 30° C. for 30 seconds to effect development, but again an image could not be formed.

(Printing Test)

An image was inscribed on the lithographic printing plates obtained by Examples 1 to 8, at an energy quantity of sensitivity required by respective lithographic printing plates, by using a test exposure machine (the wavelength: 808 nm, power: 1W, manufactured by Line Electron Co., Ltd.), and thereafter, respective plates were subjected to development processing under the same conditions as in the Examples, washed with water and dried to thereby obtain a printing plate.

The printing plates obtained in this manner were mounted on a printing machine (TOKO 820L: Tokyo Kouku Keiki Co.), respectively, to perform printing tests. Under conditions of printing speed: 3000 sheets/hour, printing paper: Jujyo Diacoat B4, ink: GEOS-G Beni S (manufactured by Dainippon Ink and Chemicals, Inc.), dampening solution: NA108W (1:50 dilution, manufactured by Dainippon Ink and Chemicals, Inc.), as the printing conditions, 6,000 sheets were printed as a printing test. The results are shown in Table 2, collectively. 6,000 sheets of prints obtained respectively did not have any quality problem, and were excellent. Moreover, after burning at 230° C. for 20 minutes, the printing test was performed in a similar manner. As a result, 20,000 sheets having no quality problems could be obtained, and any damage could not be seen on the printing face.

TABLE 2

| | Sensitivity (mJ/cm$^2$) | Preservation Stability (60° C., 15 hours) | Printing Test |
|---|---|---|---|
| Example 1 | 180 | Good | Good |
| Example 2 | 180 | Good | Good |
| Example 3 | 170 | Good | Good |
| Example 4 | 170 | Good | Good |
| Example 5 | 150 | Good | Good |
| Example 6 | 180 | Good | Good |
| Example 7 | 150 | Good | Good |
| Example 8 | 190 | Good | Good |
| Comp. Example 1 | X | Defective | — |
| Comp. Example 2 | X | Defective | — |

Example 9

40 g of the aqueous dispersion of acrylic resin fine particles (A) obtained in the Synthesis Example 3,3 g of "Carbon Black MA-100" (carbon black manufactured by Mitsubishi Chemical Corp.), 37 g of water and 20 g of isopropyl alcohol were mixed well. 180 g of 1 mm glass beads was added thereto and dispersed therein by a paint conditioner for 1 hour. Then, the glass beads were filtered and removed, to thereby obtain a solution of acrylic resin fine particles containing carbon black dispersed therein. 20 g of this solution was added to a mixture comprising 1.88 g of alkali-soluble crosslinking agent (a), 1.6 g of an aqueous solution of 1M sodium hydroxide, 3 g of water and 10 g of isopropyl alcohol, to thereby obtain a coating solution.

A substrate treated in the same manner as in Example 1 was coated with the aforementioned coating solution by using a No. 14 bar coater, and dried at 60° C. for 4 minutes, to thereby obtain a lithographic printing plate of the present invention.

By us ing this lithographic printing plate, an image was exposed in the same manner as in Example 1, developed, washed with water and dried. The sensitivity thereof was 200 mJ/cm$^2$, and a non-image portion was peeled off clearly. After the lithographic printing plate was heated at 60° C. for 15 hours, no change was seen in the sensitivity after the accelerated preservation stability test, and blurs in the non-image portion were not seen.

Examples 10 to 17

A lithographic printing plate was prepared in the same manner as in Example 9, except that the resin fine particles and the alkali-soluble crosslinking agent in Example 9 were changed to those shown in Table 3, and evaluated in a similar manner. The results are shown in Table 4 collectively.

TABLE 3

| | Resin Fine Particles | Kinds and Used Amount of Alkali-soluble Crosslinking agent | Used Amount of Aqueous Solution of 1 M Sodium Hydroxide |
|---|---|---|---|
| Example 9 | A | (a) 1.88 g | 1.6 g |
| Example 10 | A | (b) 1.88 g | 0.8 g |
| Example 11 | A | (c) 1.88 g | 0.3 g |
| Example 12 | B | (c) 1.88 g | 0.3 g |
| Example 13 | C | (c) 1.88 g | 0.3 g |
| Example 14 | D | (c) 1.88 g | 0.3 g |
| Example 15 | E | (c) 1.88 g | 0.3 g |
| Example 16 | C | (d) 1.88 g | 0.3 g |
| Example 17 | C | (e) 1.88 g | 0.3 g |

Example 18

To 100 g of the solution of the acrylic resin (1) obtained in the Synthesis Example 1 was added 2.5 g of "YKR-3070" (trade name for the infrared absorption coloring matter manufactured by Yamamoto Kasei Co., Ltd.) and mixed well. This mixture solution was neutralized with 26.7 g of aqueous solution of 1.0M sodium hydroxide, and then water was dripped thereto. The resin solution increased its viscosity slowly and when about 150 g of water was drip ped, the viscosity decreased abruptly, which indicated that the phase inversion was completed. After further addition of 150 g of water, the resulting dispersion was heated to 30° C. and the organic solvent and excess water were removed under reduced pressure. After being concentrated, water was added to obtain an aqueous dispersion having a dry solids ratio of 30%. The average particle diameter thereof was 0.2 μm.

To 10 g of this aqueous dispersion were mixed well 1.88 g of alkali-soluble crosslinking agent (c), 0.3 g of aqueous solution of I .OM sodium hydroxide, 50 g of water and 15 g of isopropyl alcohol to thereby obtain a coating solution. The coating solution was coated on the substrate obtained in a similar step as in Example 9 by using a No. 14 bar coater, and dried at 60° C. for 4-minutes, to thereby obtain a lithographic printing plate of the present invention.

By using this lithographic printing plate, an image exposure was performed, while changing the exposure dose by means of a test exposure machine mounted with a near infrared-ray semiconductor laser (wavelength: 808 nm, power: 1W, manufactured by Line Electron Co., Ltd.). After the image exposure, the plate was dipped, using a 1:99 diluted solution of a developer for positive PS plates "PD-1" (manufactured by Polychrome Japan Co., Ltd.) at 30° C. for 30 seconds to effect development, and washed with water and dried. The sensitivity thereof was 200 $mJ/cm^2$, and a non-image portion was peeled off clearly. After the lithographic printing plate was heated at 60° C. for 15 hours, no change was seen in the sensitivity after the accelerated preservation stability test, and blurs in the non-image portion were not seen.

Comparative Example 3

24 g of acrylic resin (1) obtained in the Synthesis Example 1,3 g of "Carbon Black MA-100" (carbon black manufactured by Mitsubishi Chemical Corp.), and 23 g of methyl ethyl ketone were mixed well. 90 g of 1 mm glass beads was added thereto and dispersed therein by a paint conditioner for 1 hour. Then, the glass beads were filtered and removed, to thereby obtain a solution of crylicresin containing carbon black dispersed therein. 10 g of this solution and 1.88 g of alkali-soluble crosslinking agent (a) were mixed well, and diluted with 50 g of methyl ethyl ketone to thereby obtain a coating solution. The substrate obtained in a similar step as in Example 9 was coated with the coating solution by using a No. 20 bar coater, and dried at 60° C. for 4 minutes, to thereby obtain a lithographic printing plate. The dried coating quantity was 2.0 $g/m^2$. The lithographic printing plate was dipped in a 1:9 diluted solution of the developer for positive PS plates "PD-1" (manufactured by Polychrome Japan Co., Ltd.) at 30° C. for 30 seconds, but no peeling was effected.

Comparative Example 4

24 g of acrylic resin (2) obtained in the Synthesis Example 2,3 g of "Carbon Black MA-100" (carbon black manufactured by Mitsubishi Chemical Corp.), and 23 g of methyl ethyl ketone were mixed well. 90 g of 1 mm glass beads was added thereto and dispersed therein by a paint conditioner for 1 hour. Then, the glass beads were filtered and removed, to thereby obtain a solution of acrylic resin containing carbon black dispersed therein. 10 g of this solution and 1.88 g of alkali-so luble crosslinking agent (a) were mixed well, and diluted with 50 g of methyl ethyl ketone to thereby obtain a coating solution. The substrate obtained in a similar step as in Example 9 was coated with the coating solution by using a No. 20 bar coater, and dried at 60° C. for 4 minutes, toi thereby obtain a lithographic printing plate. The dried coating quantity was 2.0 $g/m^2$.

By using this lithographic printing plate, an image exposure was performed, while changing the exposure dose by means of a test exposure machine mounted with a near infrared-ray semiconductor laser (wavelength: 808 nm, power: 1W, manufactured by Line Electron Co., Ltd.). After the image exposure, the plate was dipped, using a 1:99 diluted solution of a developer for positive PS plates "PD-1" (manufactured by Polychrome Japan Co., Ltd.) at 30° C. for 30 seconds to effect development, and washed with water and dried. With this plate, both the image portion and the non-image portion were not peeled off, and an image could not be formed. Moreover, the plate was dipped, using a 1:9 diluted solution of a developer for positive PS plates "PD-1" (manufactured by Polychrome Japan Co., Ltd.) at 30° C. for 30 seconds to effect development, but again an image could not be formed.

Comparative Example 5

To 10.8 g of an aqueous solution of polymethyl methacrylate fine particles (F) obtained in the Synthesis Example 15 were mixed well 3.4 g of "CW-1" (trade name for carbon black aqueous dispersion, manufactured by Orient Kagaku Co., Ltd., dry solids ratio: 20%), 60.9 g of water, 25 g of 2% aqueous solution of Kuraray Poval PVA-120 (trade name for polyvinyl alcohol manufactured by Kuraray Co., Ltd.), and 2.5 g of 1% aqueous solution of "NIKALAC NW-30" (trade name for methylated melamine manufactured by Sanwa Chemical Co., Ltd.). The substrate obtained in a similar step as in Example 9 was coated with the coating solution by using a No. 32 bar coater, and dried at 35° C. for a whole day and night, to thereby obtain a lithographic printing plate. The dried coating quantity was 2.0 $g/m^2$.

By using this lithographic printing plate, an image exposure was performed, while changing the exposure dose by means of a test exposure machine mounted with a near infrared-ray semiconductor laser (wavelength: 808 nm, power: 1W, manufactured by Line Electron Co., Ltd.). After the image exposure, the plate was dipped, using a mixture of water and IPA (weight iratio: 1/9) at 30° C. for 30 seconds to effect development, and washed with water and dried. The sensitivity thereof was 1,000 $mJ/cm^2$. After the lithographic printing plate was heated at 60° C. for 15 hours, and subjected to the accelerated preservation stability test, development could not be effected with the developer comprising the aforesaid mixture of water and IPA, and a sensitivity change was clearly recognized.

(Printing Test)

An image was inscribed on the lithographic printing plates obtained by Examples 9 to 16, and Comparative Example 5 at an energy quantity of sensitivity required by respective lithographic printing plates, and respective plates were subjected to development processing, washed with water and dried to thereby obtain a printing plate.

With the printing plates obtained in Examples 9 to 16, and Comparative Example 5, printing tests were performed in the same manner as in Examples 1 to 8. The results are shown in Table 4, collectively. 6,000 sheets of prints obtained respectively did not have any quality problem, and were excellent. Moreover, after burning at 230° C. for 20 minutes, the printing test was performed in a similar manner. With the lithographic printing plates obtained in Examples 9 to 16, 20,000 sheets of prints having no quality problem could be obtained, and any damage was not recognized on the printing face. However, with the lithographic printing plate obtained in Comparative Example 5, blurs were seen in the prints after about 15,000 sheets were printed.

TABLE 4

| | Sensitivity ($mJ/cm^2$) | Preservation Stability (60° C., 15 hours) | Printing Test |
|---|---|---|---|
| Example 9 | 200 | Good | Good |
| Example 10 | 190 | Good | Good |
| Example 11 | 180 | Good | Good |
| Example 12 | 180 | Good | Good |
| Example 13 | 160 | Good | Good |
| Example 14 | 190 | Good | Good |
| Example 15 | 160 | Good | Good |
| Example 16 | 180 | Good | Good |
| Example 17 | 180 | Good | Good |
| Example 18 | 200 | Good | Good |
| Comp. Example 3 | X | Defective | — |
| Comp. Example 4 | X | Defective | — |
| Comp. Example 5 | 1000 | Defective | Slightly defective |

What is claimed is:

1. A lithographic printing plate having on a substrate, a photosensitive layer comprising a photosensitive composition containing a crosslinking agent, an aqueous dispersion of resin fine particles made of a resin which is self water-dispersible having a carboxylic group and a functional group capable of performing a cross-linking reaction with the crosslinking agent, and an infrared absorption agent.

2. The lithographic printing plate as claimed in claim 1, wherein said cross-linking reaction is a reaction of a functional group selected from a group consisting of an amino group, an alkoxymethyl group and a methylol group with a functional group selected from a group consisting of a hydroxyl group, an amino group, an amide group, a carboxyl group and a glycidyl group.

3. The lithographic printing plate as claimed in claim 1, wherein resin fine particles having an average particle diameter in a range of from 0.005 to 1 μm are used.

4. The lithographic printing plate as claimed in claim 1, wherein said resin fine particles are crosslinked resin fine particles.

5. The lithographic printing plate as claimed in claim 1, wherein the crosslinking agent is an amino resin.

6. The lithographic printing plate as claimed in claim 5, wherein the amino resin is an alkali-soluble amino resin.

7. The lithographic printing plate as claimed in claim 1, wherein said crosslinking agent is an alkali-soluble amino compound derived from (4,6-diamino-1,3,5-triazine-2-yl)-benzoic acid.

8. An image forming method characterized in that after an image has been formed on a photosensitive layer of the lithographic printing plate set forth in claim 1 by using a laser beam, the image is subjected to wet development.

9. The image forming method as claimed in claim 8, wherein a laser beam having a maximum strength in the range of 760 to 3000 nm is used.

* * * * *